United States Patent
Takagiwa

(10) Patent No.: US 8,902,675 B2
(45) Date of Patent: Dec. 2, 2014

(54) SEMICONDUCTOR MEMORY DEVICE

(75) Inventor: Teruo Takagiwa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 13/604,070

(22) Filed: Sep. 5, 2012

(65) Prior Publication Data

US 2013/0235676 A1 Sep. 12, 2013

(30) Foreign Application Priority Data

Nov. 29, 2011 (JP) .................................. 2011-260860

(51) Int. Cl.
*G11C 7/10* (2006.01)
*G11C 7/06* (2006.01)

(52) U.S. Cl.
CPC ................ *G11C 7/06* (2013.01); *G11C 7/1006* (2013.01); *G11C 7/106* (2013.01)
USPC ............ 365/189.05; 365/185.05; 365/185.06; 365/185.13; 365/185.17; 365/63; 365/189.08; 365/230.01

(58) Field of Classification Search
CPC ............ H01L 27/115; H01L 27/11521; H01L 29/7883; G11C 16/10; G11C 16/0416; G11C 16/0483; G11C 16/0433; G11C 16/16; G11C 7/18; G11C 16/08; G11C 16/3418; G11C 16/26; G11C 5/063; G11C 11/4097; G11C 5/025; G11C 5/04; G11C 7/1051; G11C 7/1078; G11C 7/22; G11C 7/106; G11C 7/1057; G11C 7/1006; G11C 7/00; G11C 8/12; G11C 8/00; G11C 8/04; G11C 7/1045; H03K 19/1776; H03K 19/17704
USPC ............ 365/185.05, 185.06, 185.13, 185.17, 365/63, 189.05, 189.08, 230.01
See application file for complete search history.

(56) References Cited

U.S. PATENT DOCUMENTS

| | | | |
|---|---|---|---|
| 6,842,386 B2 | 1/2005 | Suzuki | |
| 2008/0084771 A1 | 4/2008 | Kajigaya | |
| 2011/0066878 A1* | 3/2011 | Hosono et al. | ................. 714/6.1 |
| 2011/0235430 A1* | 9/2011 | Morton et al. | ............ 365/185.21 |

FOREIGN PATENT DOCUMENTS

| | | |
|---|---|---|
| JP | 8-221998 | 8/1996 |
| JP | 2008-97675 | 4/2008 |

\* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

A semiconductor memory device according to an embodiment includes a memory cell array that includes a plurality of cell columns each configured by a plurality of memory cells, and a column control circuit that includes a plurality of sense amplifier-data latch units each including a plurality of sense amplifiers that detect and amplify data of the memory cells and a plurality of data latches. One of the plurality of sense amplifier-data latch units is a first sense amplifier-data latch unit and another of the plurality of sense amplifier-data latch units is a second sense amplifier-data latch unit, the first sense amplifier-data latch unit and the second sense amplifier-data latch unit having different numbers of the cell columns capable of being handled.

18 Claims, 5 Drawing Sheets

US 8,902,675 B2

SEMICONDUCTOR MEMORY DEVICE

CROSS-REFERENCE TO RELATED APPLICATIONS

This application is based upon and claims the benefit of priority from the prior Japanese Patent Application No. 2011-260860, filed on Nov. 29, 2011, the entire contents of which are incorporated herein by reference.

FIELD

Embodiments described herein relate generally to a semiconductor memory device.

BACKGROUND

Recently, semiconductor memory devices such as a NAND flash memory employ a configuration in accordance with the miniaturization in which one control circuit, one arithmetic circuit, one data bus, and the like are shared in units of one or more cell columns. Accordingly, the circuit scale of the control circuit and the like can be deceased, whereby an increase in the chip area can be suppressed. Particularly when one control circuit and the like are shared in units of a plurality of cell columns, it is large effective to suppress the chip area.

However, for example, in a case where a plurality of sense amplifiers and data latches, one control circuit, and the like for data processing of n cell columns are configured as one unit (a sense amplifier-data latch unit or a cell column unit), a total number of cell columns of the semiconductor memory device is limited to a multiple of n.

DETAILED DESCRIPTION

A semiconductor memory device according to an embodiment includes a memory cell array that includes a plurality of cell columns each configured by a plurality of memory cells and a column control circuit that includes a plurality of sense amplifier-data latch units each including a plurality of sense amplifiers that detect and amplify data of the memory cells and a plurality of data latches. One of the plurality of sense amplifier-data latch units is a first sense amplifier-data latch unit and another of the plurality of sense amplifier-data latch units is a second sense amplifier-data latch unit, the first sense amplifier-data latch unit and the second sense amplifier-data latch unit having different numbers of the cell columns capable of being handled.

Hereinafter, semiconductor memory devices according to the embodiments will be described with reference to the drawings.

[First Embodiment]

Figure 1:
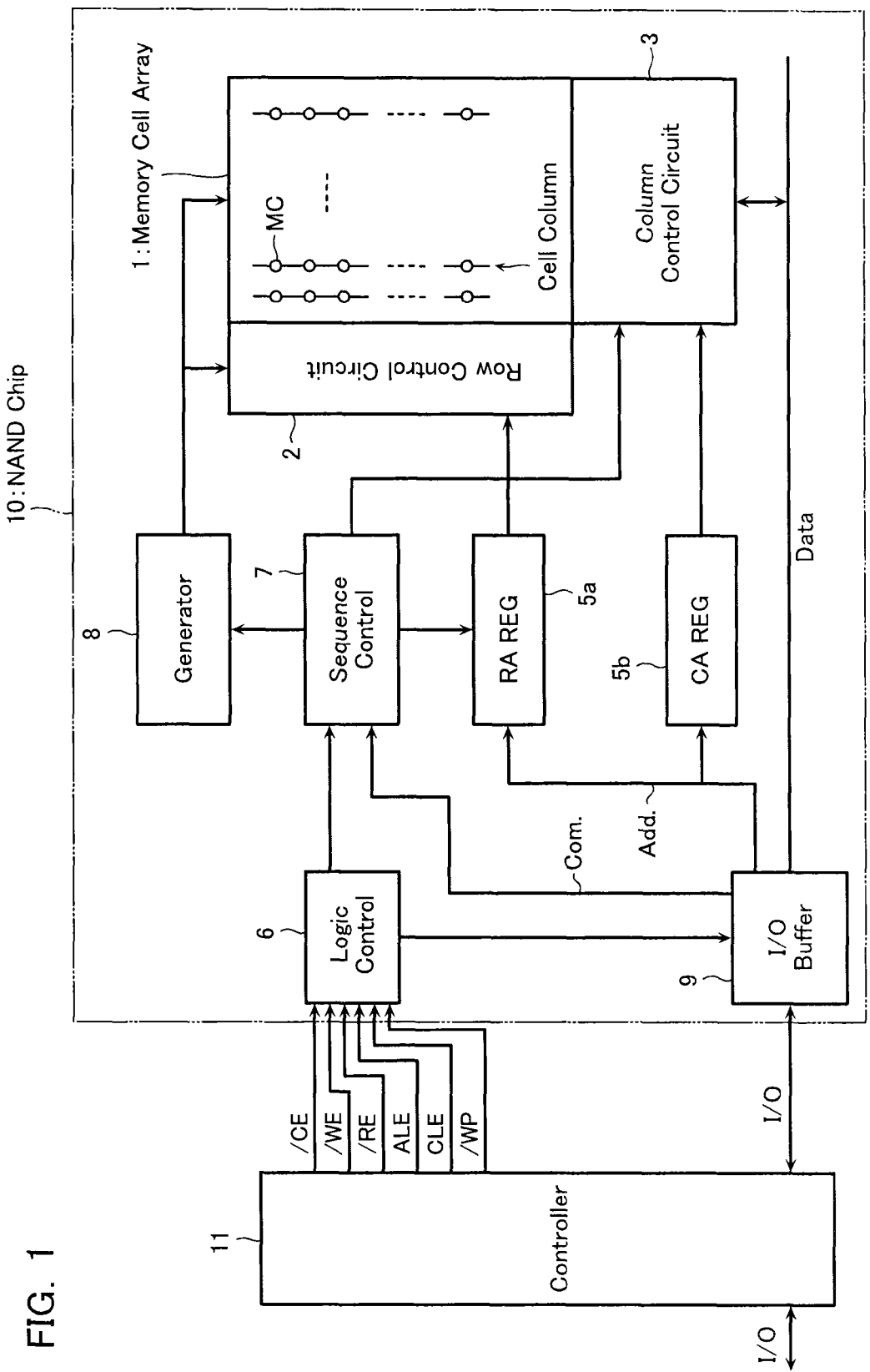
FIG. 1 is an exemplary block diagram illustrating a semiconductor memory device according to a first embodiment.

FIG. 1 is a block diagram illustrating a semiconductor memory device according to a first embodiment. Here, although a NAND flash memory is employed as the semiconductor memory device, this embodiment can be applied not only to NAND flash memories but also to all the semiconductor memory devices using a sense amplifier and a data latch.

The NAND flash memory includes a NAND chip 10 and a controller 11 that controls the NAND chip 10.

The memory cell array 1 is configured by arranging a plurality of memory cells MCs each having a charge accumulating layer in a matrix pattern. Hereinafter, a unit formed by a plurality of memory cells MCs aligned in the column direction may be referred to as a "cell column".

On the periphery of the memory cell array 1, a row control circuit 2, a column control circuit 3, and a voltage generating circuit 8 are arranged. These row control circuit 2 and the column control circuit 3 receive instructions from a sequence control circuit 7 to be described later and write or read data with respect to the memory cell array 1 in units of pages.

The row control circuit 2 drives a word line and a selection gate line of the memory cell array 1. The column control circuit 3, for example, includes sense amplifiers and data latches corresponding to one page. Data corresponding to one page, which is read by the column control circuit 3, is output to an external I/O terminal through an I/O buffer 9. In addition, the write data supplied from the I/O terminal is loaded into the column control circuit 3. The write data corresponding to one page is loaded into the column control circuit 3. A row address signal and a column address signal are input through the I/O buffer 9 and are transmitted to the row control circuit 2 and the column control circuit 3.

A row address register 5a maintains an erasing block address or a page address. A first column address used for loading write data before the start of a write sequence or a first column address used for a read sequence is input to the column address register 5b. The column address register 5b maintains the input column address until a write enable /WE or a read enable /RE is toggled in a predetermined condition.

In addition, a bit line is connected to each sense amplifier. The bit line is connected to a memory cell of the memory cell array 1. Data transmission and data reception between the memory cell and the sense amplifier are performed through the bit line. The sense amplifier can detect, amplify, and maintain data of the memory cell. Furthermore, a plurality of the bit lines may be connected to the sense amplifier.

A plurality of the data latches can receive data of the memory cells from the sense amplifier and can maintain the data.

The logic control circuit 6 receives commands of control signals such as a chip enable signal /CE, a command enable signal CLE, an address latch enable signal ALE, a write enable signal /WE, and a read enable signal /RE that are transmitted from the controller 11. The logic control circuit 6 controls the input of an address and the input/output of data based on the commands. When a command is received, the logic control circuit 6 instructs the sequence control circuit 7 to perform sequence control of a read operation, a write operation, or an erasing operation. The voltage generating circuit 8 is controlled by the sequence control circuit 7 and generates predetermined voltages that are required for various operations.

The controller 11 controls the writing or reading of data in a condition that is appropriate to the current writing state of the NAND chip 10.

Next, the sense amplifier and the data latch of the semiconductor memory device according to this embodiment will be described. In addition, in the case of the semiconductor memory device (NAND flash memory) illustrated in FIG. 1, the sense amplifier and the data latch are included in the column control circuit 3.

Figure 2:
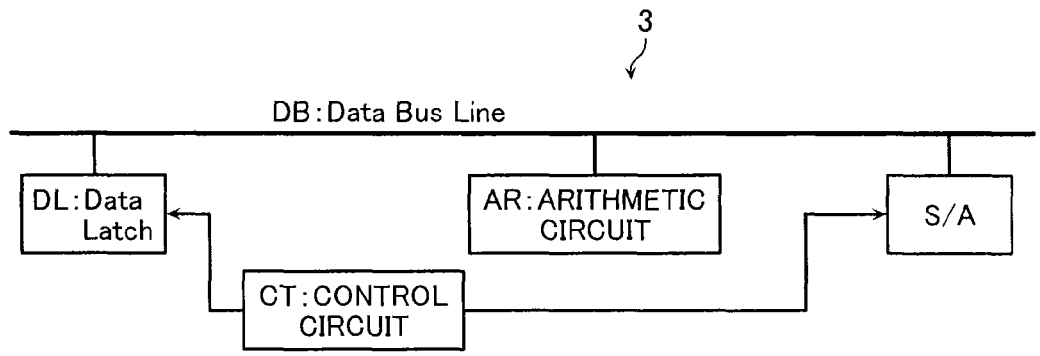
FIG. 2 is a diagram illustrating a configuration example of a sense amplifier and a data latch of a semiconductor memory device according to the embodiment.

FIG. 2 is a diagram illustrating the configuration of the sense amplifier and the data latch of the semiconductor memory device according to this embodiment.

Figure 3:
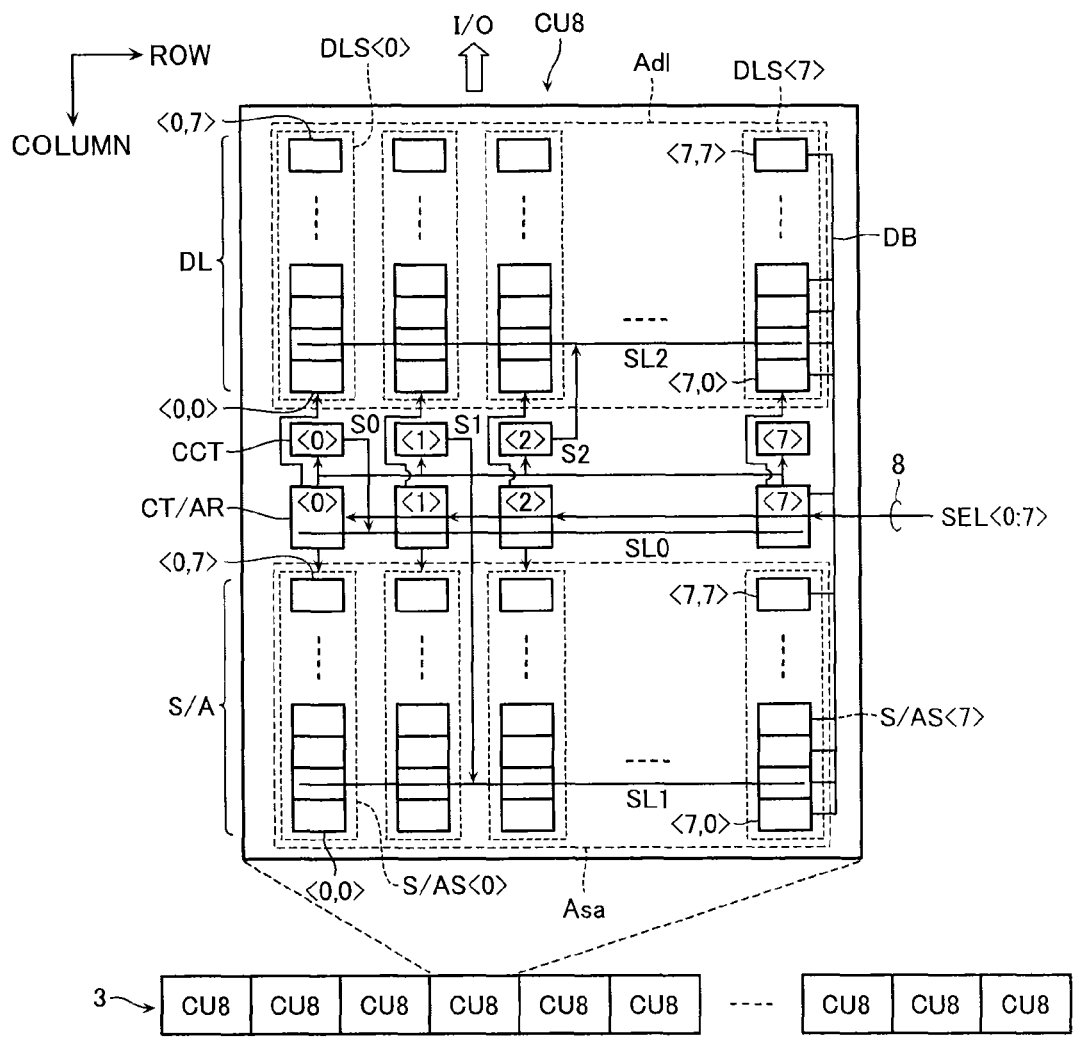
FIG. 3 is a diagram illustrating the configurations of a sense amplifier-data latch unit of a semiconductor memory device according to a comparative example of the embodiment and a column control circuit using the sense amplifier-data latch units.

The sense amplifier S/A and the data latch DL are interconnected through a data bus DB. The sense amplifier S/A and the data latch DL are controlled by the control circuit CT. This control circuit CT includes a circuit that performs simple decoding of data or temporary storage of data. In addition, the arithmetic circuit AR is connected to the sense amplifier S/A and the data latch DL through the data bus DB. The arithmetic circuit AR performs AND/OR of data of the sense amplifier S/A and data of the data latch DL or a logical operation that is necessary for determining the completion of data writing. This arithmetic circuit AR, as illustrated in FIG. 3, may be arranged between the sense amplifier S/A and the data latch DL.

In a case where the semiconductor memory device is shrunk, for example, the arithmetic circuit AR is configured to be shared in units of cell columns. Accordingly, for example, in a case where one cell column is configured as 8 bits, data processing of 8 bits can be performed by one arithmetic circuit AR. Accordingly, compared to a conventional semiconductor memory device that is configured by eight arithmetic circuits AR for each column, the chip area can be decreased. Similarly, by sharing the control circuit CT in units of cell columns, the chip area corresponding thereto is decreased as well. In a case where the control circuit CT and the arithmetic circuit AR are shared in units of a plurality of cell columns, the chip area is decreased further. Accordingly, the sense amplifier-data latch unit that includes the sense amplifier S/A, the data latch DL, the data bus DB, the control circuit CT, and the arithmetic circuit AR in FIG. 2 can be configured in units of a plurality of cell columns. Hereinafter, a unit acquired by configuring the sense amplifier-data latch unit in units of a plurality of cell columns may be referred to as a "cell column unit".

Next, a method of configuring the column control circuit 3 using the cell column unit will be described.

First, a comparative example as a premise of this embodiment will be described.

FIG. 3 is a diagram illustrating the configurations of a cell column unit of a semiconductor memory device according to a comparative example and a column control circuit using the cell column unit. Hereinafter, a cell column unit that can be in correspondence with n (here, n is an integer that is one or more) cell columns will be referred to as an "n cell column unit". In FIG. 3, eight cell columns are arranged in the row direction. In other words, the cell column unit illustrated in FIG. 3 is an "8-cell column unit".

The 8-cell column unit CU8 illustrated in FIG. 3 has a layout in which eight sense amplifier sets S/AS<i> each formed by eight sense amplifiers S/A<i, 0> to S/A<i, 7> (here, i is an integer in the range of 0 to 7) aligned in the column direction at the same position in the row direction are aligned in the row direction at the same position in the column direction. Here, the number of sense amplifiers S/A included in the 8-cell column unit CU8 may be the same as that of the data latches DL. Similarly, the 8-cell column unit CU8 has a layout in which eight data latch set DLS<i> configured by eight data latches DL<i, 0> to DL<i, 7> (here, i is an integer in the range of 0 to 7) aligned in the column direction at the same position in the row direction are aligned in the row direction at the same position in the column direction. Here, the sense amplifier set S/AS<i> and the data latch set DLS<i> correspond to the i-th cell column of the memory cell array 1.

In addition, in the 8-cell column unit CU8, a control/arithmetic circuit CT/AR<i> and a common control circuit CCT<i> are arranged between the sense amplifier set S/AS<i> and the data latch set DLS<i>. The control/arithmetic circuit CT/AR<i> is a functional block that corresponds to the arithmetic circuit AR and the control circuit CT illustrated in FIG. 2.

Hereinafter, a configuration that includes the sense amplifier set S/SA<i>, the data latch set DLS<i>, and the control/arithmetic circuit CT/AR<i> may be referred to as a "column set CC".

In the case illustrated in FIG. 3, each one of the common control circuits CCT<0> to CCT<7> includes one or a plurality of common control circuits CCT1 to CCT4 having the following functions.

The common control circuit CCT1 transmits a control signal S0 so as to be common to the control/arithmetic circuits CT/AR<0> to CT/AR<7> through a signal line SL0 and controls the control/arithmetic circuits.

The common control circuit CCT2 selects one set aligned in the row direction out of the sense amplifiers S/A<i, 0> to S/A<i, 7> by using a control signal S1. In other words, the common control circuit CCT2 selects one set out of the sense amplifiers S/A<0, 0> to S/A<7, 0>, S/A<0, 1> to S/A<7, 1>, . . . , S/A<0, 7> to S/A<7, 7>. The control signal S1 is transmitted to the sense amplifiers S/A<0, j> to S/A<7, j> (here, j is an integer in the range of 0 to 7) so as to be common thereto through a signal line SL1 (in the case of FIG. 3, only the signal line SL1 traversing the sense amplifiers S/A<0, 1> to S/A<7, 1> is illustrated) disposed for each set of the sense amplifiers S/A<0, j> to S/A<7, j>.

The common control circuit CCT3 selects one set aligned in the row direction out of the data latches DL<i, 0> to DL<i, 7> by using a control signal S2. In other words, the common control circuit CCT3 selects one set out of the data latches DL<0, 0> to DL<7, 0>, DL<0, 1> to DL<7, 1>, . . . , DL<0, 7> to DL<7, 7>. The control signal S2 is transmitted to the data latches DL<0, j> to DL<7, j> so as to be common thereto through a signal line SL2 (in the case of FIG. 3, only the signal line SL2 traversing the data latches DL<0, 1> to DL<7, 1> is illustrated) disposed for each set of the data latches DL<0, j> to DL<7, j>.

The common control circuit CCT4 temporarily stores data, which is common to the cell column units CU, for each cell column unit CU.

The control/arithmetic circuit CT/AR<i> performs a control operation and a calculation operation that are necessary for data processing of the sense amplifier set S/AS<i> and the data latch set DLS<i>. A column set to be selected out of the column sets CC0 to CC7 is designated in accordance with a column selection signal SEL<0:7> that is input to the control/arithmetic circuit CT/AR<i>. Then, the control/arithmetic circuit CT/AR<i> corresponding to the cell column designated in accordance with the column selection signal SEL<0:7>, for example, instructs the common control circuit CCT to perform the following or the like.

(i) The output of data of the data latch DL<i, j> to the data bus DB (ii) The transmission of data of the sense amplifier S/A<i, j> to the data latch DL<i, j> through the data bus DB In addition, when the data of the sense amplifier S/A<i, j> is transmitted to the data latch DL<i, j> through the data bus DB, the control/arithmetic circuit CT/AR<i> may make a calculation such as an inversion of the data.

The column control circuit 3 of the semiconductor memory device according to the comparative example, as illustrated in FIG. 3, is configured by aligning a plurality of the above-described 8-cell column units CU8 in the row direction. For example, by aligning 128 8-cell column units CU8, a column control circuit 3 that can handle 1024 cell columns can be configured. In addition, in a case where eight redundant cell columns used for replacing cell columns are arranged, one additional 8-cell column unit CU8 may be further added. In such a case, a column control circuit 3 can be configured which can handle a total of 1032 cell columns acquired by adding 1024 cell columns that are normally used and eight redundant cell columns.

However, in a case where the column control circuit 3 is configured by the 8-cell column units CU8, the number of cell columns, which the column control circuit 3 can handle, can be adjusted only to a multiple of eight. In such a case, for example, even in a case where the optimal number of redundant cell columns is 12, it is necessary to add two 8-cell column units CU8. In such a case, naturally, the arrangement area of the sense amplifiers S/A and the data latches DL corresponding to four cell columns is in surplus. In other words, an unnecessary increase in the chip area of the semiconductor memory device is caused. To the contrary, in a case where only eight redundant cell columns are arranged based on the relation of the adjustment unit regardless of the optimal number of redundant cell columns as 12, naturally, the product yield of the semiconductor memory device is decreased.

Here, although a case has been described in which the number of cell columns that are normally used is 1024, in a case where the number of cell columns for storing an error correction code (ECC) is 12, the number of redundant cell columns is limited to 8m+4 (here, m is an integer). As above, in a case where the column control circuit 8 is configured only by the 8 cell column units CU8, the number of redundant cell columns is limited to 8m+k (here, k is an integer). In other words, the number of cell columns that the column control circuit 3 can handle needs to be adjusted to one of discrete values depending on the number of cell columns that can be handled by the 8-cell column units CU8.

Accordingly, as in the comparative example, in a case where the column control circuit is configured only by one kind of cell column units CU, the selection of the number of redundant columns is restricted, whereby in that a system according to an optimal number of redundant columns cannot be configured.

Thus, in this embodiment, the column control circuit 3 is configured by a plurality of kinds of cell column units. Accordingly, the number of cell columns that the column control circuit 3 can handle can be freely adjusted.

Figure 4:
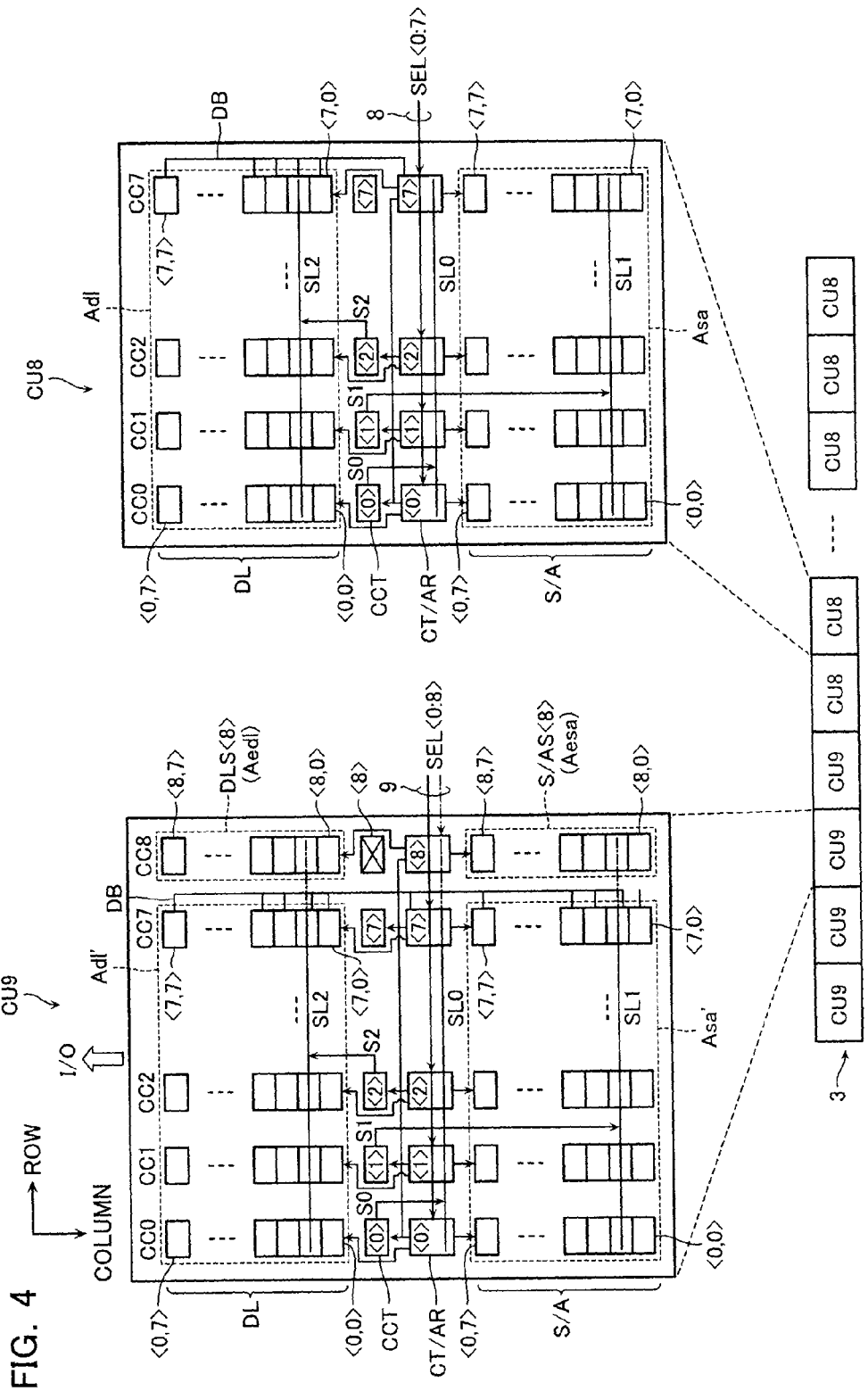
FIG. 4 is a diagram illustrating configuration examples of a sense amplifier-data latch unit of a semiconductor memory device according to the embodiment and a column control circuit using the sense amplifier-data latch units.

FIG. 4 is a diagram illustrating configuration examples of a cell column unit of the semiconductor memory device according to this embodiment and a column control circuit 3 using the cell column units.

In the case of this embodiment, the column control circuit 3 is configured by a 9-cell column unit CU9 (second sense amplifier-data latch unit), of which the number of cell columns that can be handled is nine, in addition to the above-described 8-cell column unit CU8 (first sense amplifier-data latch unit).

The 9-cell column unit CU9 has nine layouts of the column set of the 8-cell column unit CU8 illustrated in FIG. 3. In other words, the 9-cell column unit CU9 has a layout to which an expanded column set CC8 having a layout that is almost equal to that of the column set CC of the 8-cell column unit CU8. The expanded column set CC8 includes a sense amplifier set S/AS<8>, a data latch set DLS<8>, and a control/arithmetic circuit CT/AR<8>. Here, the number of sense amplifiers S/A included in the 9-cell column unit CU9 and the number of the data latches DL may be configured to be the same.

In particular, the 9-cell column unit CU9 includes an expanded sense amplifier set S/AS<8> having a layout equal to the sense amplifier set S/AS<i> of the 8-cell column unit CU8 in an area Aesa that is adjacent to an area Asa' corresponding to the area Asa, in which the sense amplifier sets S/AS<0> to S/AS<7> of the 8-cell column unit CU8 are arranged, in the row direction at the same position in the column direction. Similarly, the 9-cell column unit CU9 includes an expanded data latch DLS<8> having a layout equal to the data latch DLS<i> of the 8-cell column unit CU8 in an area Aedl that is adjacent to an area Adl' corresponding to the area Adl, in which the data latch sets DLS<0> to DLS<7> of the 8-cell column unit CU8 are arranged, in the row direction at the same position in the column direction. In addition, a control/arithmetic circuit CT/AR<i> having a layout equal to that of the control/arithmetic circuit CT/AR<i> of the 8-cell column unit CU8 is included between the sense amplifier set SAS<8> and the data latch set DLS<8>. Furthermore, as denoted by dashed-dotted lines in FIG. 4, signal lines SL0, SL1, and SL2 are extended in the row direction and are connected to the expanded control/arithmetic circuit CT/AR<8>, the expanded sense amplifier set S/AS<8>, and the expanded data latch set DLS<8>, and a column selection signal SEL<8> used for selecting the expanded control/arithmetic circuit CT/AR<8> is prepared, whereby the 9-cell column unit CU9 can be configured. In addition, a common control circuit CCT (second common control circuit) of the 9-cell column unit CU9 may have the same configuration as that of the common control circuit CCT (first common control circuit) of the 8-cell column unit CU8. As a result, the common control circuit CCT<8> of the 9-cell column unit CU9 may be omitted. In other words, only by arranging the expanded control/arithmetic circuit CT/AR_8>, the expanded sense amplifier set S/AS<8>, and the expanded data latch set DLS<8> in the 8-cell column unit CU8, the 9-cell column unit CU9 is generated. Accordingly, the circuit design can be made in an easy manner.

For example, a case will be considered in which a column set CC0 of a certain 8-cell column unit CU8 is defective. For example, when a column selection signal SEL<0> is input, the control circuit 7 skips the defective column set CC0 and transmits a signal used for selecting the column set CC0 of the 8-cell column unit CU8, which is adjacent thereto, to the column control circuit 3. As a result, the control/arithmetic circuit CT/AR<0> of the 8-cell column unit CU8, which is adjacent thereto, is selected, and data stored in the data latches DL<0, 0> to DL<0, 7> is output to the I/O. At this time, the data may be temporarily stored and used for a calculation by the control/arithmetic circuit CT/AR<1>. Here, since the column set CC0 is skipped as a defective set, there is a lack of one column set CC. Thus, the lack of the column set CC is supplemented with the column set CC8 of the 9-cell column unit CU9. Alternatively, when a column selection signal SEL<0> is input, the control circuit 7 may be configured to replace the column selection signal SEL<0> with a column selection signal SEL<8> of the 9-cell column unit CU9 and transmit the column selection signal SEL<8> to the column control circuit 3.

Next, a method of configuring the column control circuit 3 by using the 8-cell column unit CU8 and the 9-cell column unit CU9 will be described. Here, as in the comparative example, a case will be described in which the number of cell columns that are normally used is 1024, and the optimal number of redundant cell columns is 12.

In such a case, in order to configure the column control circuit 3 corresponding to this, 12 9-cell column units CU9 and 116 8-cell column units CU8 may be aligned in the row direction. Alternatively, 4 9-cell column units CU9 and 117 8-cell column units CU8 may be aligned in the row direction. In any one of the cases, the arrangement area of an unnecessary column set or an extra area accompanied with the arrangement area may not be repeated.

Accordingly, by preparing two kinds of cell column units as in this embodiment, the column control circuit 3 corresponding to an optimal number of redundant cell columns can be configured in an appropriate chip area.

The lack of column set CC may be supplemented with one of the column set CC of the 9-cell column unit CU9. Further, the lack of column set CC may be supplemented with one of the column set CC of the 8-cell column unit CU8. And the 9-cell column unit CU9 may include a plurality of redundancy cell columns. The 8-cell column unit CU may include a plurality of redundancy cell columns, also.

Then, the column set CC8 of the 9-cell column unit CU9 is not limited to use only redundancy. So the column set CC8 of the 9-cell column unit CU9 can be used to adjust a total number of cell columns of the semiconductor memory device.

Next, an access operation in the case of this embodiment will be briefly described.

In this embodiment, by collectively accessing cell columns corresponding to a plurality of cell column units in accordance with the column selection signal SEL<i>, a high-speed read operation and a high-speed write operation can be realized.

In addition, output of data to the outside thereof is performed in units of cell columns. In other words, as the control/arithmetic circuit CT/AR<i> is selected in accordance with a read column selection signal SEL<0:7>, one selection column is selected. Here, the selected control/arithmetic circuit CT/AR<i> outputs data stored in the data latch DL<i, j> belonging to the selected cell column to the outside at a time.

In addition, the read column selection signal SEL<0:7> may be given so as to sequentially increment "i" included in the control/arithmetic circuit CT/AR<i> in accordance with a clock signal and select the control/arithmetic circuit. As a result, by standing by the data output to the data latch DL<i, j> of the cell column unit CU in the state of being stored and sequentially selecting the cell unit selected in accordance with the column selection signal SEL<0:7>, the output of the data to the outside can be performed at a high speed.

For example, first, the cell column CC0 is accessed in accordance with a column selection signal SEL<0> for all the 8-cell column units CU8 and all the 9-cell column units CU9. Accordingly, for example, in the case of a read operation, the data of the cell column CC0 corresponding to each 8-cell column unit CU8 and each 9-cell column unit CU9 can be prepared all at once by all the 8-cell column units CU8 and all the 9-cell column units CU9, and accordingly, the data can be immediately read.

In particular, after all the column sets CC0 of the 8-cell column units CU8 and the 9-cell column units CU9 are selected, data is sequentially output to the I/O starting from the column set CC0 located on the left side in the row direction. Then, after the column set CC0 of the 8-cell column unit 8 that is located on the rightmost side in the row direction is selected, a column selection signal SEL<1> is transmitted from the control circuit 7.

Subsequently, the cell column set CC1 is accessed in accordance with a column selection signal SEL<1> for all the 8-cell column units CU8 and all the 9-cell column units CU9. These accesses are sequentially performed starting from the column set CC1 of the 9-cell column unit CU9 that is located on the leftmost side. Then, similar operations are repeated, and, after the data of the column set CC7 of the 8-cell column unit CU8 that is located on the rightmost side in the column direction is output to the I/O, a column selection signal SEL<8> is transmitted from the control circuit 7.

Subsequently, the cell column set CC8 is accessed in accordance with a column selection signal SEL<8> for all the 8-cell column units CU8 and all the 9-cell column units CU9. These accesses are sequentially performed starting from the column set CC8 of the 9-cell column unit CU9 that is located on the leftmost side. Then, after output of the data of the column set CC8 of the 9-cell column unit CU9 that is located on the rightmost side in the column direction is completed, the read operation is completed. Accordingly, from the viewpoint of a high-speed access, it is preferable that the column units CU9 are continuously arranged.

[Second Embodiment]

In the first embodiment, a case has been described in which the sense amplifier set S/AS and the data latch set DLS extend in one row in the column direction. However, there is a case where data of the sense amplifier set S/AS or data of the data latch set DLS is assigned in a plurality of rows in the column direction. Thus, in a second embodiment, a case will be described in which the column control circuit 3 is configured by such cell column units. Here, points different from those of the first embodiment will be mainly focused on, and the description of the other points will not be presented here.

Figure 5:
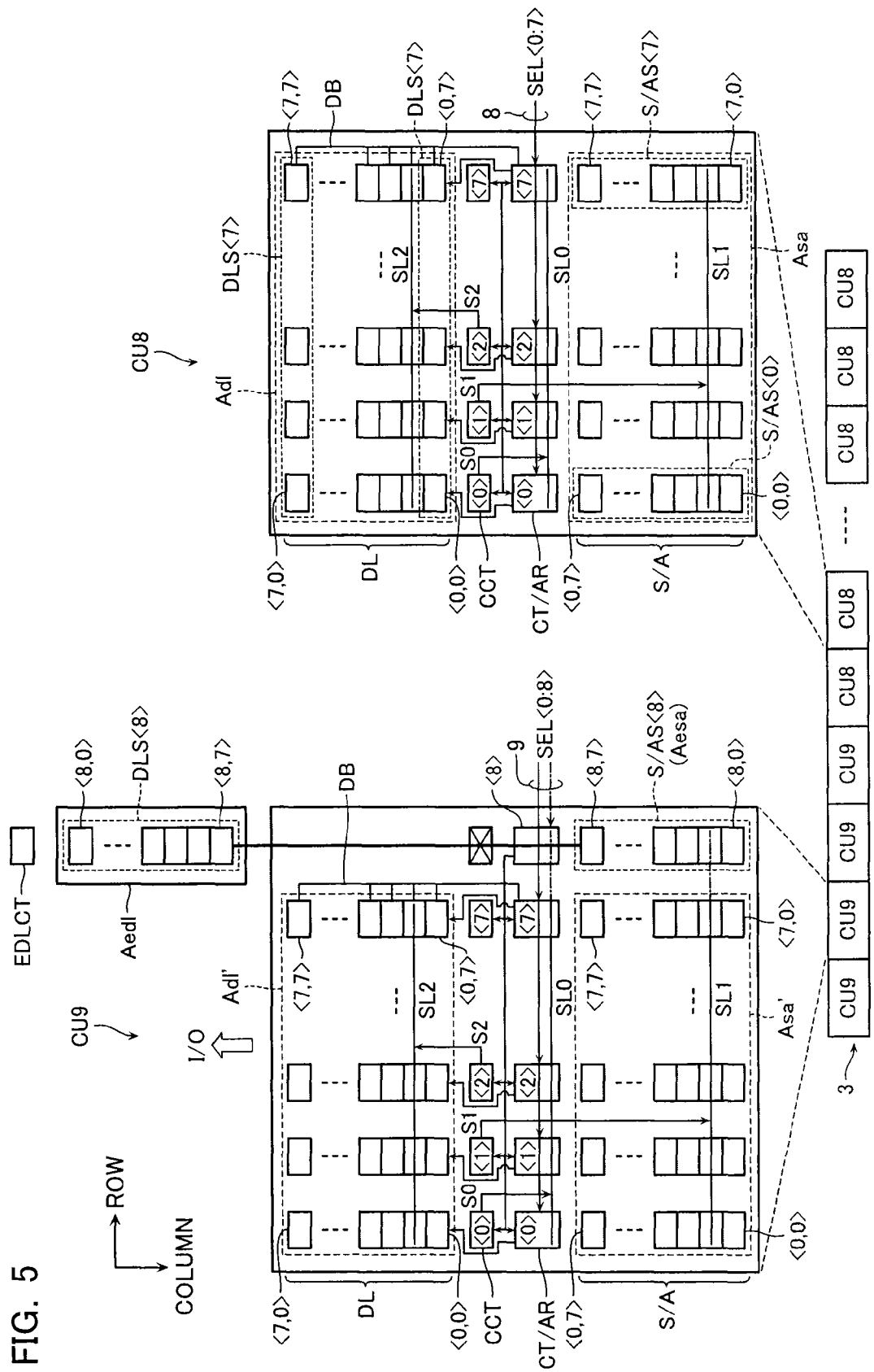
FIG. 5 is a diagram illustrating configuration examples of a sense amplifier-data latch unit of a semiconductor memory device according to a second embodiment and a column control circuit using the sense amplifier-data latch units.

FIG. 5 is a diagram illustrating the configuration examples of a sense amplifier-data latch unit of a semiconductor memory device according to this embodiment and a column control circuit using the sense amplifier-data latch units. The column control circuit 3 according to this embodiment, as illustrated in FIG. 5, is configured by the 8-cell column units CU8 (the first sense amplifier-data latch units) and 9-cell column units CU9 (the second sense amplifier-data latch units).

However, in the case of the 8-cell column unit CU8 according to this embodiment, the assignment of data for the data latch set DLS<i> is different from that of the first embodiment. In particular, the 8-cell column unit CU8 performs assignment in which matrix inversion is performed for data of the sense amplifiers SA<0, 0> to SA<0, 7> aligned in the column direction, and the resultant data is stored in the data latches <0, 0> to <7, 0>. Similarly, data of the sense amplifiers SA<1, 0> to SA<1, 7> aligned in the column direction is stored in the data latches <0, 1> to <7, 1>.

For example, the control/arithmetic circuit CT/AR<1> selects the sense amplifiers <0, 1> to <7, 1> in which the common control circuit CCT<1> is aligned in the row direction and stores the data stored in the sense amplifiers <0, 1> to <7, 1> in the data latches DL<0, 1> to DL<7, 1> aligned in the column direction. At this time, the data may be temporarily stored and used for a calculation by the control/arithmetic circuit CT/AR<1>.

In addition, the 9-cell column unit CU9, similarly to the first embodiment, one expanded column set formed from a sense amplifier set S/AS<8> and a data latch set DLS<8> is configured to be added to the 8-cell column unit CU8. For example, a case will be considered in which a column set CC0 of a certain 8-cell column unit CU8 is defective. For example, when a column selection signal SEL<0> is input, the control circuit 7 skips the defective column set CC0 and transmits a signal used for selecting the column set CC0 of the 8-cell column unit CU8, which is adjacent thereto, to the column control circuit 3. As a result, the control/arithmetic circuit CT/AR<0> of the 8-cell column unit CU8, which is adjacent thereto, is selected, and data stored in the data latches DL<0, 0> to DL<0, 7> is output to the I/O. At this time, the data may be temporarily stored and used for a calculation by the control/arithmetic circuit CT/AR<0>. Here, since the column set CC0 is skipped as a defective set, there is a lack of one column set CC. Thus, the lack of the column set CC is supplemented with the column set CC8 of the 9-cell column unit CU9. Alternatively, when a column selection signal SEL<0> is input, the control circuit 7 may be configured to replace the column selection signal SEL<0> with a column selection signal SEL<8> of the 9-cell column unit CU9 and transmit the column selection signal SEL<8> to the column control circuit 3.

The data latches DL<8, 0> to DL<8, 7> of the expanded column set can be arranged so as to be adjacent to the data latches DL<7, 0> to DL<7, 7> in the column direction. However, as in the first embodiment, in a case where the column set is simply aligned in the column direction, the width of the 9-cell column unit CU9 and the width of the 8-cell column unit CU8 in the column direction are different from each other. Here, it is preferable that any one end of the 8-cell column unit CU8 and the 9-cell column unit CU9 in the column direction is uniformly arranged from the viewpoint of the layout. As a result, there is a case where a space of the 8-cell column unit CU8 in the column direction, which corresponds to a portion of the 9-cell column unit CU9 that protrudes from the 8-cell column unit CU8, becomes a dead space.

Thus, in the example illustrated in FIG. 5, the expanded sense amplifier set S/AS<8>, similarly to the first embodiment, is arranged in the area Aesa (first expanded area) that is adjacent to the area Asa' corresponding to the area Asa (first area), in which the sense amplifier sets S/AS<0> to S/AS<7> of the 8-cell column unit CU8 are arranged, in the row direction at the same position in the column direction. On the other hand, in the expanded data latch set DLS<8>, the area Asa in which the sense amplifier set S/AS<0> to S/AS<7> of the 8-cell column unit CU8 are arranged and areas Asa' and Adl' corresponding to the area Adl (second area) in which the data latch sets DLS<0> to S/AS<7> are arranged are arranged in an external area Aex (second expanded area) that is located at a different position in the column direction. The external area Aex may be a portion that is adjacent to the data latches DL<0, 7> to DL<7, 7> in the row direction. Furthermore, an empty space that is present in the column control circuit may be used.

In addition, near the expanded data latch set DLS<8>, an external data latch control circuit EDLCT used for controlling the expanded data latch set DSL<8> located in the external area Aex may be disposed. In addition, for the data transmission between the sense amplifier S/A<8, j> (here, j is an integer in the range of 0 to 7) of the expanded sense amplifier set S/AS<8> and the data latch DL<8, j> of the expanded data latch set DLS<8>, the data bus DB may be used, which is used for the data transmission between another sense amplifier <i, j> and the data latch DL<i, j>, to be common thereto. As a result, the width of the 9-cell column unit CU9 and the width of the 8-cell column unit CU8 in the column direction can be configured to be almost equal to each other.

Figure 6:
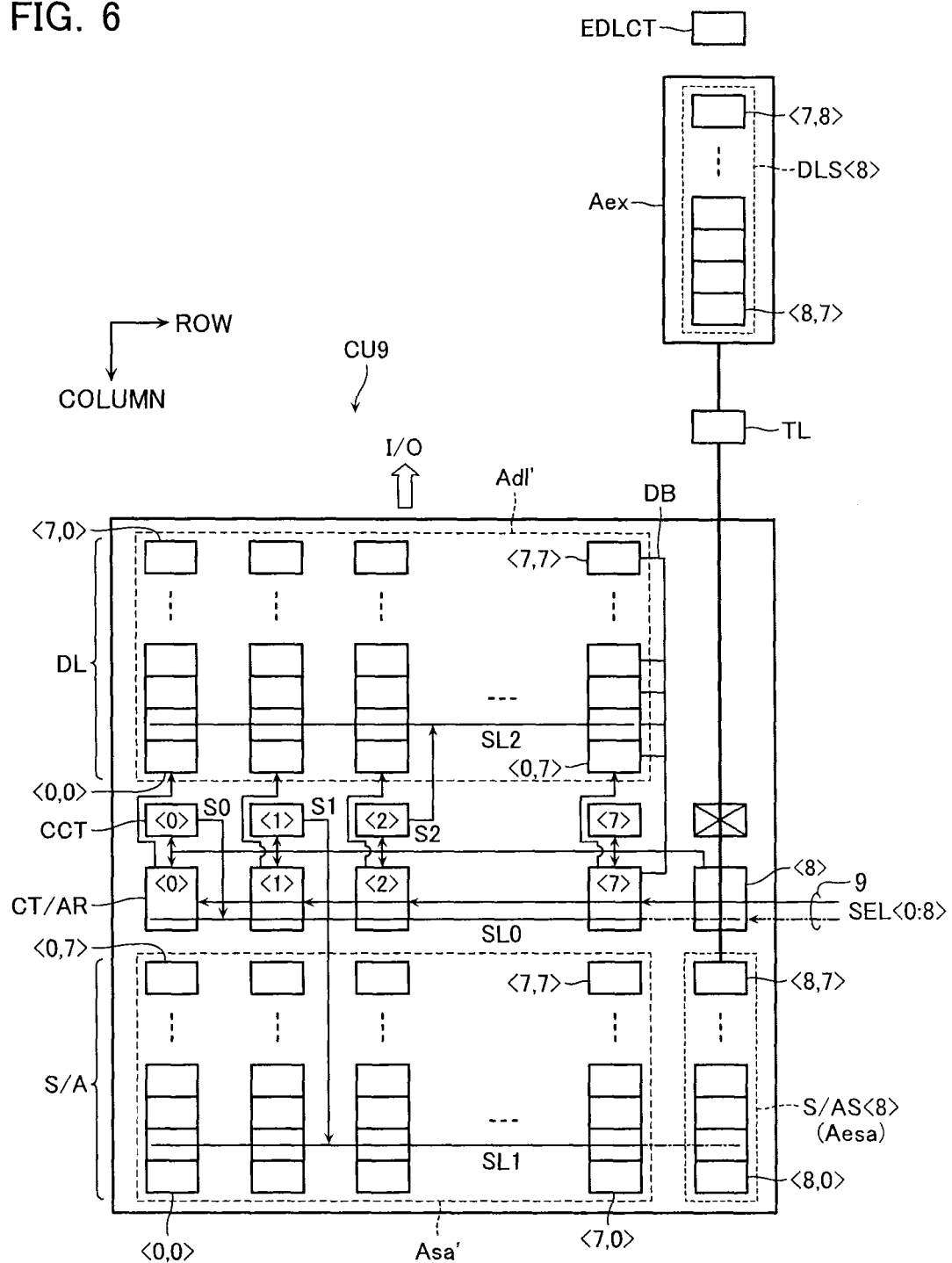
FIG. 6 is a diagram illustrating a configuration example of a sense amplifier-data latch unit of a semiconductor memory device according to the embodiment.

In addition, in a case where a distance between the data latch set DLS<8> located in the external area Aex and the sense amplifier set S/AS<8> is long, as illustrated in FIG. 6, it may be configured such that a temporary latch circuit TL is prepared on the data bus DB, and the data transmission is performed through the latch circuit between the sense amplifier set S/A<8, j> and the data latch DL<8, j>.

A method of configuring the column control circuit 3 by using the 8-cell column units CU8 and the 9-cell column units CU9, which are illustrated in FIGS. 5 and 6, is similar to that of the first embodiment, and thus, the description thereof will not be presented here. In addition, the number of sense amplifiers S/A and the number of data latches DL that are included in the 9-cell column unit CU9 may be configured to be same with the expanded data latch set DSL<8> located in the external area Aex being taken into account.

As above, according to this embodiment, even in a case where the sense amplifier set or the data latch set is arranged in a plurality of rows in the column direction, the same advantages as those of the first embodiment can be acquired.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described embodiment, although the 8-cell column unit CU8 is configured as the first sense amplifier-data latch unit, the number of cell columns that can be handled by the first sense amplifier-data latch unit is arbitrary. In addition, although both the second sense amplifier-data latch units according to the above-described embodiments have the number of cell columns, which can be handled, acquired by adding one to the number of cell columns of the first sense amplifier-data latch unit, there may be a difference of, for example, two or more, between the number of cell columns of the second sense amplifier-data latch unit, which can be handled, and the number of cell columns of the first sense amplifier-data latch unit, which can be handled. In addition, in both embodiments described above, although the column control circuit is configured by a combination of two types of sense amplifier-data latch sets, the column control circuit may be configured by a combination of three or more types of sense amplifier-data latch units. Furthermore, although both the second sense amplifier-data latch units according to the above-described embodiments have a layout that is acquired by adding another column set to a layout that is equal to that of the first sense amplifier-data latch unit, the first sense amplifier-data latch unit may be configured to have a layout that is completely different from that of the second sense amplifier-data latch unit.

What is claimed is:

1. A semiconductor memory device comprising:
a memory cell array that includes a plurality of cell columns each configured by a plurality of memory cells; and a column control circuit that includes a plurality of sense amplifier-data latch units each including a plurality of sense amplifiers that detect and amplify data of the memory cells and a plurality of data latches,
one of the plurality of sense amplifier-data latch units is a first sense amplifier-data latch unit and another of the plurality of sense amplifier-data latch units is a second sense amplifier-data latch unit, the first sense amplifier-data latch unit and the second sense amplifier-data latch unit having different numbers of the cell columns capable of being handled,
wherein, when a set of the sense amplifiers capable of handling one of the cell columns is set as a sense amplifier set, a set of the data latches capable of handling one of the cell columns is set as a data latch set, and a set of the one of the sense amplifier sets and the one of the data latch sets is set as a column set,
each sense amplifier-data latch unit includes a common control circuit that is used in common for controlling a plurality of column sets of the respective sense amplifier-data latch unit, and
a common control circuit of the second sense amplifier-data latch unit has a circuit scale equal to that of a common control circuit of the first sense amplifier-data latch unit.

2. The semiconductor memory device according to claim 1, wherein, the layout of a plurality of the column sets of the second sense amplifier-data latch unit is the same as the layout of the plurality of the column sets of the first sense amplifier-data latch unit, and
the layout of a plurality of data latch sets of the second sense amplifier-data latch unit is different from that of a plurality of data latch sets of the first sense amplifier-data latch unit.

3. The semiconductor memory device according to claim 2, wherein the first sense amplifier-data latch unit performs matrix inversion of data of the sense amplifiers aligned in a column direction and stores resultant data in the data latches, and
the second sense amplifier-data latch unit performs matrix inversion of data of the sense amplifiers aligned in a column direction and stores resultant data in the data latches.

4. The semiconductor memory device according to claim 2, wherein the first sense amplifier-data latch unit and the second sense amplifier-data latch unit have the same width in the column direction.

5. The semiconductor memory device according to claim 1, wherein, the column control circuit includes a latch circuit on a data bus between the sense amplifier set of the second sense amplifier-data latch unit and a data latch set of the second sense amplifier-data latch unit.

6. The semiconductor memory device according to claim 1, wherein, the layout of each column set of the second sense amplifier-data latch unit is the same as the layout of each column set of the first sense amplifier-data latch unit.

7. A semiconductor memory device comprising:
a memory cell array that includes a plurality of cell columns each configured by a plurality of memory cells; and
a column control circuit that includes a plurality of sense amplifier-data latch units each including a plurality of sense amplifiers that detect and amplify data of the memory cells and a plurality of data latches,
one of the plurality of sense amplifier-data latch units is a first sense amplifier-data latch unit and another of the plurality of sense amplifier-data latch units is a second sense amplifier-data latch unit, the first sense amplifier-data latch unit and the second sense amplifier-data latch unit having different numbers of the cell columns capable of being handled,
some of the plurality of cell columns included in the memory cell array being redundant cell columns that are used for redundancy, and
the number of the cell columns included in the memory cell array being the same as a total number of the cell columns that the column control circuit is capable of handling,
wherein, when a set of the sense amplifiers capable of handling one of the cell columns is set as a sense amplifier set, a set of the data latches capable of handling one of the cell columns is set as a data latch set, and a set of the one of the sense amplifier sets and the one of the data latch sets is set as a column set,
each sense amplifier-data latch unit includes a common control circuit that is used in common for controlling the plurality of column sets of the respective sense amplifier-data latch unit, and
a common control circuit of the second sense amplifier-data latch unit has a circuit scale equal to that of a common control circuit of the first sense amplifier-data latch unit.

8. The semiconductor memory device according to claim 7, wherein, the layout of a plurality of the column sets of the second sense amplifier-data latch unit is substantially the same as the layout of the plurality of the column sets of the first sense amplifier-data latch unit, and
the layout of a plurality of data latch sets of the second sense amplifier-data latch unit is different from that of a plurality of data latch sets of the first sense amplifier-data latch unit.

9. The semiconductor memory device according to claim 8, wherein the first sense amplifier-data latch unit performs matrix inversion of data of the sense amplifiers aligned in a column direction and stores resultant data in the data latches, and
the second sense amplifier-data latch unit performs matrix inversion of data of the sense amplifiers aligned in a column direction and stores resultant data in the data latches.

10. The semiconductor memory device according to claim 8, wherein the first sense amplifier-data latch unit and the second sense amplifier-data latch unit have the same width in the column direction.

11. The semiconductor memory device according to claim 7, wherein, the column control circuit includes a latch circuit on a data bus between the sense amplifier set and a data latch set of the second sense amplifier-data latch unit.

12. The semiconductor memory device according to claim 7, wherein, the layout of each column set of the second sense amplifier-data latch unit is substantially the same as the layout of each column set of the first sense amplifier-data latch unit.

13. A semiconductor memory device comprising:
a memory cell array that includes a plurality of cell columns each configured by a plurality of memory cells; and
a column control circuit that includes a plurality of sense amplifiers that detect and amplify data of the memory cells and a plurality of data latches, wherein, when a set of the sense amplifiers capable of handling one of the cell columns is set as a sense amplifier set, a set of the data latches capable of handling one of the cell columns is set as a data latch set, and a set of the one of the sense amplifier sets and the one of the data latch sets is set as a column set, the column control circuit includes a plurality of common control circuits that are used in common for controlling a predetermined number of the column sets, and the plurality of common control circuits includes a first common control circuit and a second common control circuit, the number of the column sets controlled by the first common control circuit and the number of the column sets controlled by the second common control circuit are different from each other.

14. The semiconductor memory device according to claim 13, wherein the circuit scale of the second common control circuit is equal to the circuit scale of the first common control circuit.

15. The semiconductor memory device according to claim 13, wherein, when the predetermined number of the column sets that are controlled in common by the first common control circuit is set as a first column set group, and the predetermined number of the column sets that are controlled in common by the second common control circuit is set as a second column set group, the layout of the second column set group is equal to the layout of the first column set group, and the layout of a plurality of the data latch sets included in the second column set group is different from the layout of a plurality of the data latch sets included in the first column set group.

16. The semiconductor memory device according to claim 15, wherein the first common control circuit performs matrix inversion of data of the sense amplifiers of the first column set group, which are aligned in a column direction, and stores resultant data in the data latches of the first column set group, and the second common control circuit performs matrix inversion of data of the sense amplifiers of the second column set group, which are aligned in the column direction, and stores resultant data in the data latches of the second column set group.

17. The semiconductor memory device according to claim 15, wherein the first column set group and the second column set group have the same width in the column direction.

18. The semiconductor memory device according to claim 13, wherein, when the predetermined number of the column sets that are controlled in common by the second common control circuit is set as a second column set group, the column control circuit includes a latch circuit on a data bus between the sense amplifier set and the data latch set of the second column set group.

* * * * *